(12) United States Patent
Ohdachi

(10) Patent No.: US 6,230,021 B1
(45) Date of Patent: *May 8, 2001

(54) DIGITAL CORDLESS COMMUNICATION SYSTEM WITH FREQUENCY DEVIATION CORRECTION CAPABILITY

(75) Inventor: Toshiaki Ohdachi, Yokohama (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/069,848

(22) Filed: Apr. 30, 1998

(30) Foreign Application Priority Data

May 19, 1997 (JP) .................................................. 9-142935

(51) Int. Cl.[7] ................................................ H04B 7/19
(52) U.S. Cl. ........................ 455/502; 455/260; 455/524; 370/324; 375/356
(58) Field of Search ................................... 455/502, 503, 455/524, 259, 260, 88, 554, 555, 75, 76; 375/356, 376; 370/324, 350

(56) References Cited

U.S. PATENT DOCUMENTS

| 5,423,058 | * | 6/1995 | Cudak et al. ........................ 455/503 |
| 5,530,704 | * | 6/1996 | Gibbons et al. ..................... 375/356 |
| 5,612,981 | * | 3/1997 | Huizer ................................. 375/376 |
| 5,801,783 | * | 9/1998 | Ross ................................... 455/502 |

FOREIGN PATENT DOCUMENTS 6318963    11/1994   (JP) .

* cited by examiner

*Primary Examiner*—Lee Nguyen
(74) *Attorney, Agent, or Firm*—Stevens, Davis, Miller & Mosher, LLP

(57) ABSTRACT

A digital cordless telecommunication system capable of maintaining the enhanced frequency stability of radio transmission signals from stationary base stations by use of a specific clock signal including either a high-precision clock or a reference clock as generated by main equipment. In this system the main equipment is provided with a high-precision oscillator that generates and issues a clock signal with increased pulse-phase accuracy, whist a respective one of the base stations is with a line interface for extraction of such high-precision clock signal from the high-precision oscillator, a reference oscillator which supplies a reference clock to a frequency synthesizer that generates a local oscillation signal, a frequency error detector operable to detect a difference or "error" in frequency between the reference clock of the reference oscillator and the high-precision clock of the line interface, and a reference oscillator controller which is responsive to receipt of the error signal from the frequency error detector for adjusting any possible frequency deviation of the reference oscillator causing the reference clock frequency of the reference oscillator to keep track of the frequency of the high-precision clock signal.

23 Claims, 6 Drawing Sheets

FIG. 4A PULSES WHEN ONE-MILLION COUNTING CLOCK A (125 SEC. INTERVAL)

FIG. 4B PULSES OF CLOCK B (125 μSEC. INTERVAL)

FIG. 4C PULSES WHEN ONE-MILLION COUNTING CLOCK B (125 SEC. INTERVAL)

DIGITAL CORDLESS COMMUNICATION SYSTEM WITH FREQUENCY DEVIATION CORRECTION CAPABILITY

BACKGROUND OF THE INVENTION

1. Field of the Invention

The present invention relates generally to wireless telecommunication technologies and, more particularly, to digital cordless communication systems including a plurality of stationary base stations for radio communication with multiple mobile communication units and main equipment for interconnection of such base stations to public telephone networks. The invention also relates to digital wireless communication systems with increased frequency stability of radio signals at plural base stations.

2. Description of the Related Art

One typical prior known digital cordless communication system of the type stated above has been disclosed, for example, in Published Unexamined Japanese Patent Application No. 6-318963 ("JP-A-6-318963"), wherein the system is designed to operatively associate with portable mobile communication units (also referred to as "handheld radiotelephone transceivers" or "personal stations" among those skilled in the art) having transmit-and-receive frequency stabilization functions. FIG. 1 depicts a typical electronics configuration of one such personal station.

In FIG. 1 the mobile personal station (PS) is generally designated by reference numeral 60, which is constituted from a receiver circuit 602 which receives a digital radio frequency (RF) signal transmitted over-the-air from one base station—called the "cell station" in some cases—to an antenna 601 and then outputs an intermediate frequency signal, a frequency synthesizer 608 for supplying a local oscillation frequency signal to the receiver circuit 602, a reference oscillator 607 for generation of a signal for use as a reference of frequency at the frequency synthesizer 608, a demodulator 603 that is operable to reproduce or "play back" a carrier wave from the intermediate frequency signal as output from receiver 602 and also demodulate a received signal using as its phase reference signal a certain signal synchronized in phase with the carrier wave, a frequency counter 604 for counting up the frequency of such carrier wave reproduced by demodulator 603, a frequency error detector section 605 that uses the count value of this frequency counter 604 to detect any possible frequency difference or "error" of the reference oscillator 607, and a reference oscillator control circuit 606 responsive to receipt of an error detection signal from the frequency error detector 605 for controlling the oscillation frequency of reference oscillator 607. It is thus possible, based on the frequency of a signal received from the cell station (CS), to achieve frequency stability of those signals as transmitted thereto from one or more mobile PSs.

Additionally, numeral 609 designates a modulator circuit for modulating a transmitted signal by the local oscillation signal fed from the frequency synthesizer 608; 610 denotes a power amplifier for power amplification of the resultant transmit signal as modulated by the modulator 609; 611, a demodulation data monitor circuit of the demodulator 603; and 612, a reference signal control circuit of demodulator 603.

Unfortunately, the prior art frequency stabilization scheme suffers from a problem in that upon failure of accurate synchronization of a reference clock signal in the frequency stabilization control loop employed in wireless CSs, any signal received from a CS is no longer used directly for frequency stabilization of mobile PSs because of the fact that the conventional system is inherently designed to effectuate intended PS frequency stabilization based on such received signal only.

SUMMARY OF THE INVENTION

It is therefore an object of the present invention to provide a digital cordless communication system capable of avoiding the problem faced with by the prior art.

It is another object of the invention to provide an improved digital cordless telecommunication system capable of attaining and maintaining increased frequency stability of a reference clock signal for use as a reference in generating transmit signals in respective stationary base stations.

It is a further object of the invention to provide an improved digital cordless telecommunication system capable of attaining and holding superior frequency stability of a reference clock signal used as a reference in generating transmit signals in each base station, by use of either a high-precision "master" clock signal generated by main equipment or a master clock signal synchronized with such high-precision clock signal as received by a radio transceiver operatively associated with the main equipment.

A digital cordless communication system in accordance with a first principal aspect of this invention includes a plurality of stationary base stations located within respective geographical coverage regions assigned thereto for communication with multiple mobile communication units, and a system controller for connection of the base stations to a public telephone network. The system controller includes a high-precision oscillator which generates a master clock signal, whereas each base station includes a clock generator for receiving the master clock signal from the system controller for providing a reference clock signal as synchronized with the master clock signal.

A digital cordless communication system in accordance with a second aspect of the invention includes a plurality of base stations for over-the-air communication with personal communication units within respective geographical coverage areas or "zones" assigned to the base stations, a system controller for connection of the base stations to a public telephone network, and at least one radio receiver for outputting, upon receipt of a radio frequency (RF) signal as externally transmitted thereto, the received signal to the main equipment. The system controller includes a first clock generator for generation of a master clock signal synchronized with a signal being presently received at the radio receiver. Each of the base stations includes therein a second clock generator for receiving the master clock signal from the main equipment to generate a reference clock signal as synchronized to the master clock signal.

These and other objects, features and advantages of the invention will be apparent from the following more particular description of preferred embodiments of the invention, as illustrated in the accompanying drawings.

DETAILED DESCRIPTION OF THE EMBODIMENTS

Some preferred embodiments of the present invention will now be described with reference to the accompanying drawings below.

(FIRST EMBODIMENT)

Figure 2:
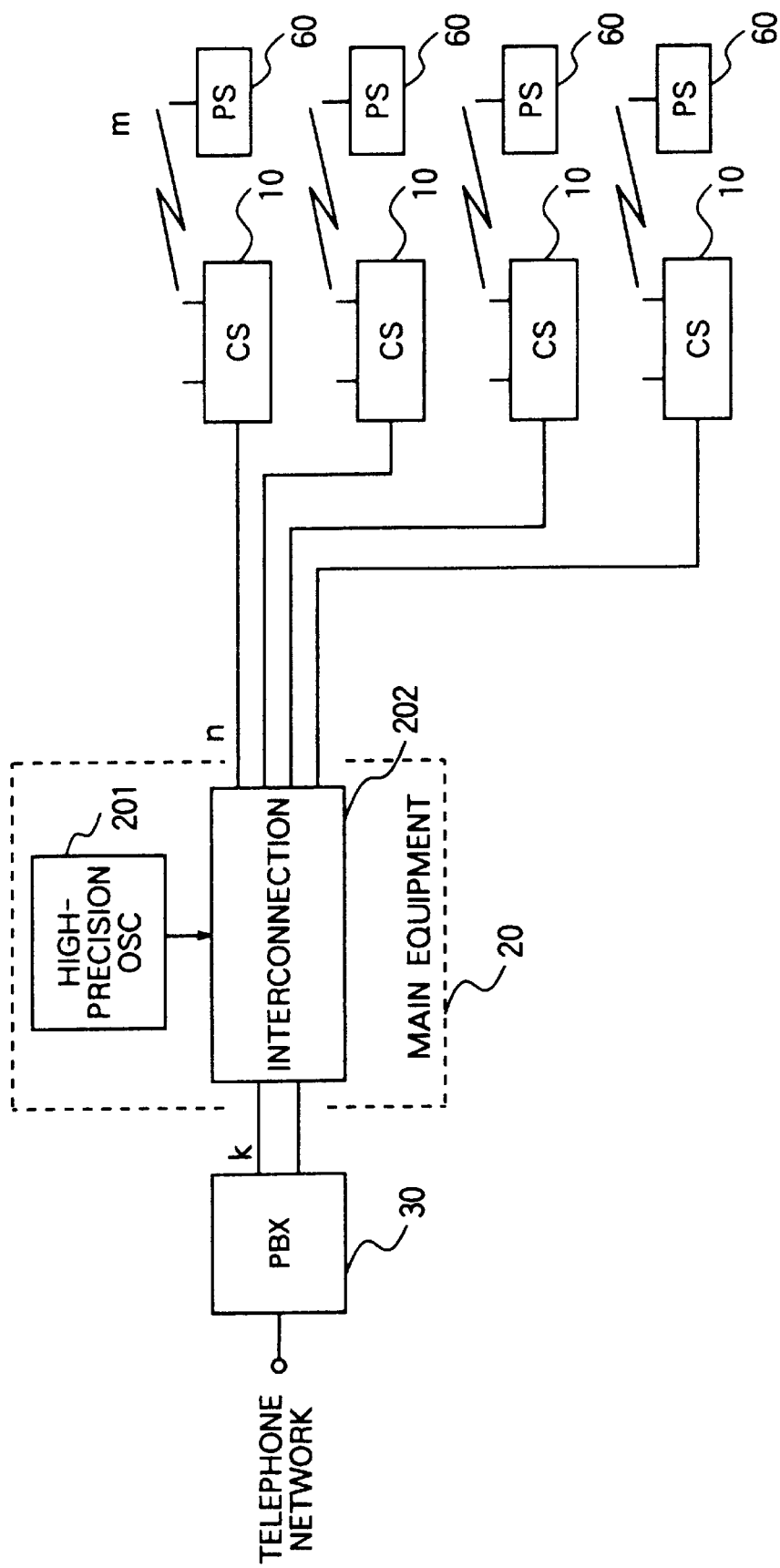
FIG. 2 is a block diagram showing a configuration of a mobile radiotelephone transceiver handset employable in a digital cordless communication system in accordance with a first embodiment of the invention.

As shown in FIG. 2, a digital cordless city-wide communication system in accordance with a first embodiment of the invention includes a main apparatus or system central controller 20, a predefined number—say, "n"—of stationary communication units or "base stations" 10, and a specified number ("m") of mobile communication units 60. The base stations 10 may be referred to as "cell stations" whereas the mobile communication units 60 as "personal stations" in some cases. A private branch exchange (PBX) facility 30 is operatively coupled to the main equipment 20 for interconnecting "k" communication lines of this system to a public telephone network, which may be the public switched telephone network (PSTN). Here, the numbers k, n and m are in the relation of k<n<m, where n is an integer greater than 1.

The main equipment 20 includes a high-precision oscillator 201 that generates a high-precision clock signal with enhanced pulse phase accuracy, and an interconnection module or router 202 which provides adequate electrical interconnections between the cell stations (CSs) 10 and PBX 30 by transmit-and-receive of digital signals using the high-precision clock signal. Accordingly, the high-precision clock signal generated by high-precision oscillator 201 is employable as a "master" clock signal in CSs 10. The main equipment 20 is also designed to perform position management in this system, including handling of certain information as to geographical coverage areas or "zones" assigned to respective CSs 10.

Figure 1:
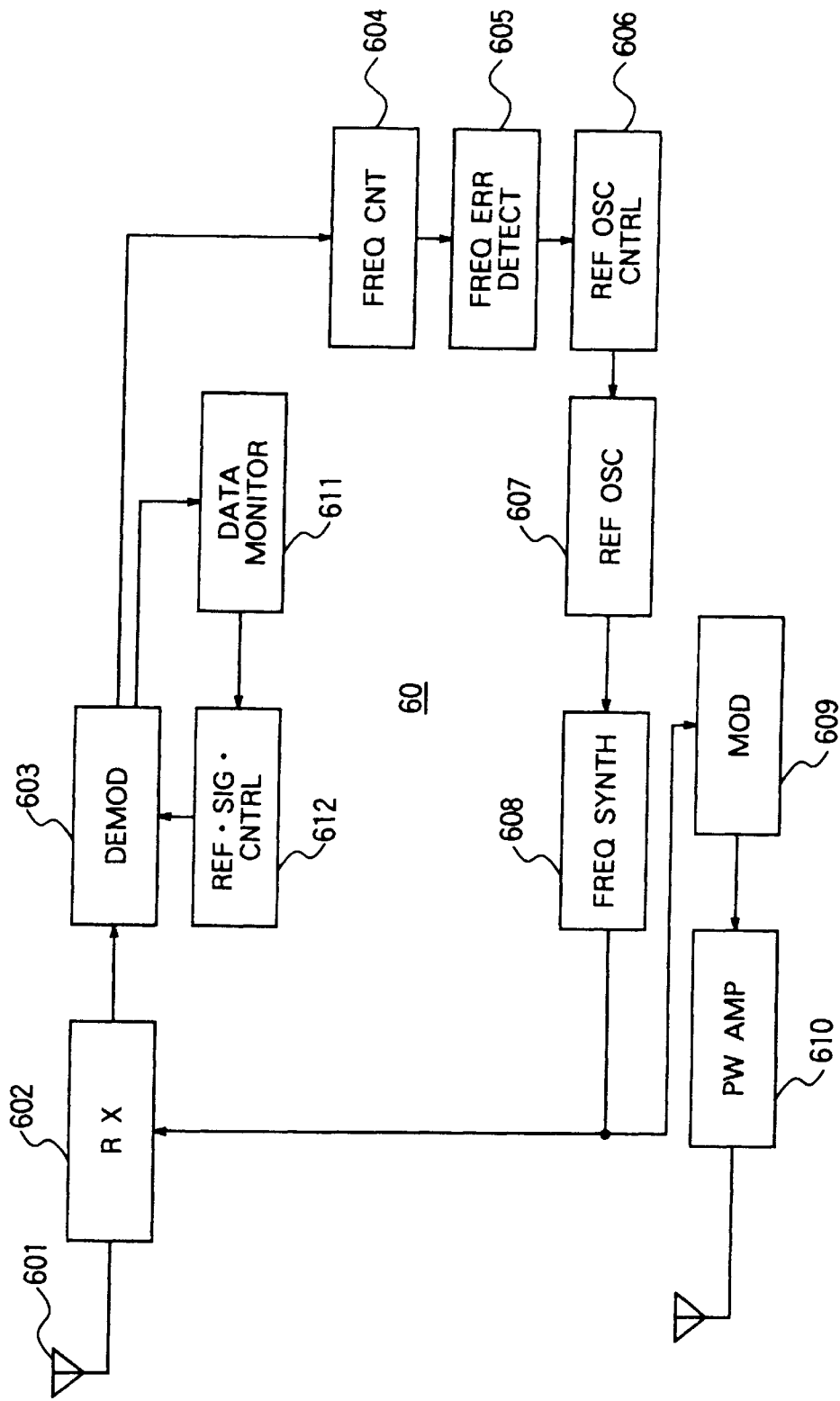
FIG. 1 is a block diagram showing a configuration of a mobile radiotelephone transceiver handset unit or personal station employed in prior art digital cordless communication systems.

The mobile personal stations (PSs) 60 as employed herein may be portable cordless radiotelephone transceivers or telephone handset units, which may be similar to the prior art shown in FIG. 1.

Figure 3:
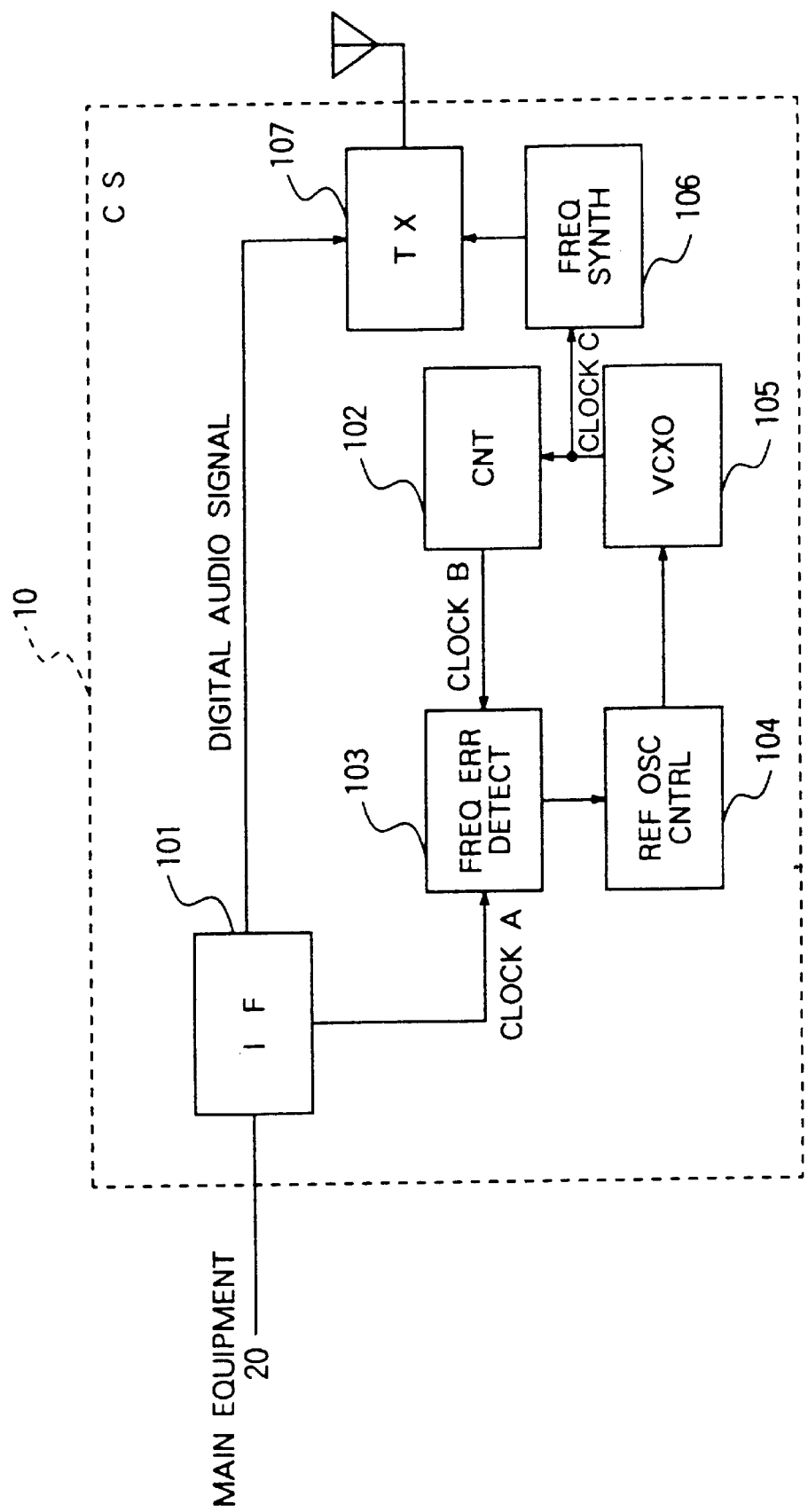
FIG. 3 is a block diagram depicting a configuration of one of stationary base stations in the digital cordless communication system in accordance with the first embodiment of the invention.
}

Referring to FIG. 3, the individual one of the CSs 10 includes a line interface section 101 operable to extract by phase locked loop (PLL) techniques the high-precision master clock signal as sent from the main equipment 20 then generating and issuing an extracted signal as a reproduced clock signal A, a reference oscillator 105 including a voltage controlled crystal oscillator (VCXO) for generation of a reference signal C with an output clock frequency deviation variable by a control voltage as fed thereto, a counter 102 which counts up for frequency division the reference clock C from reference oscillator 105, a frequency error detection section 103 that receives the reproduced high-precision clock signal A extracted by line interface 101 along with a frequency-divided clock signal B from counter 102 to detect any possible frequency difference or "error" therebetween, a reference oscillation control section 104 responsive to an error signal from the frequency error detector 103 for adjusting a frequency deviation of reference oscillator 105, a frequency synthesizer 106 responsive to receipt of the reference clock signal C from reference oscillator 105 for generating and issuing a local oscillation signal, and a transmitter section 107 for sending forth radio frequency (RF) signals based on the local oscillation signal from frequency synthesizer 106.

An operation of the digital cordless communication system embodying the invention thus arranged is as follows.

In the main equipment 20, the router/connector unit 202 effectuates processing of audio/voice signals as input from the PBX 30 based on the high-precision clock signal generated by the high-precision oscillator 201, thereby outputting resultant digital signals to CSs 10 operatively associated therewith.

The line interface 101 of each CS 10 operates to extract, from a corresponding one of the digital signals output from the main equipment 20, a high-precision clock as the reproduced clock signal A. The counter 102 frequency-divides the reproduced clock signal A by counting up the reference clock pulses C from reference oscillator 105 to thereby provide a frequency-divided clock signal B identical in frequency to—i.e. accurately synchronized with—the reproduced clock signal A, which signal B is then output to the frequency error detector 103. Upon reception of such clock signal A and clock signal B, frequency error detector 103 detects a difference in frequency therebetween if any.

Assume that the clock signal A is 8 kilohertz (KHz) in frequency (125 microseconds in period), by way of example. To detect a frequency error of clock signal A with 1 ppm being as a unit, it is necessary to count those pulses of clock signals A, B for one million times; and, a frequency error may be detectable by determining how clock signal B is deviated in pulse phase relative to clock signal A—that is, how many clock pulses the former is phase-shifted by from the latter.

Figure 4:
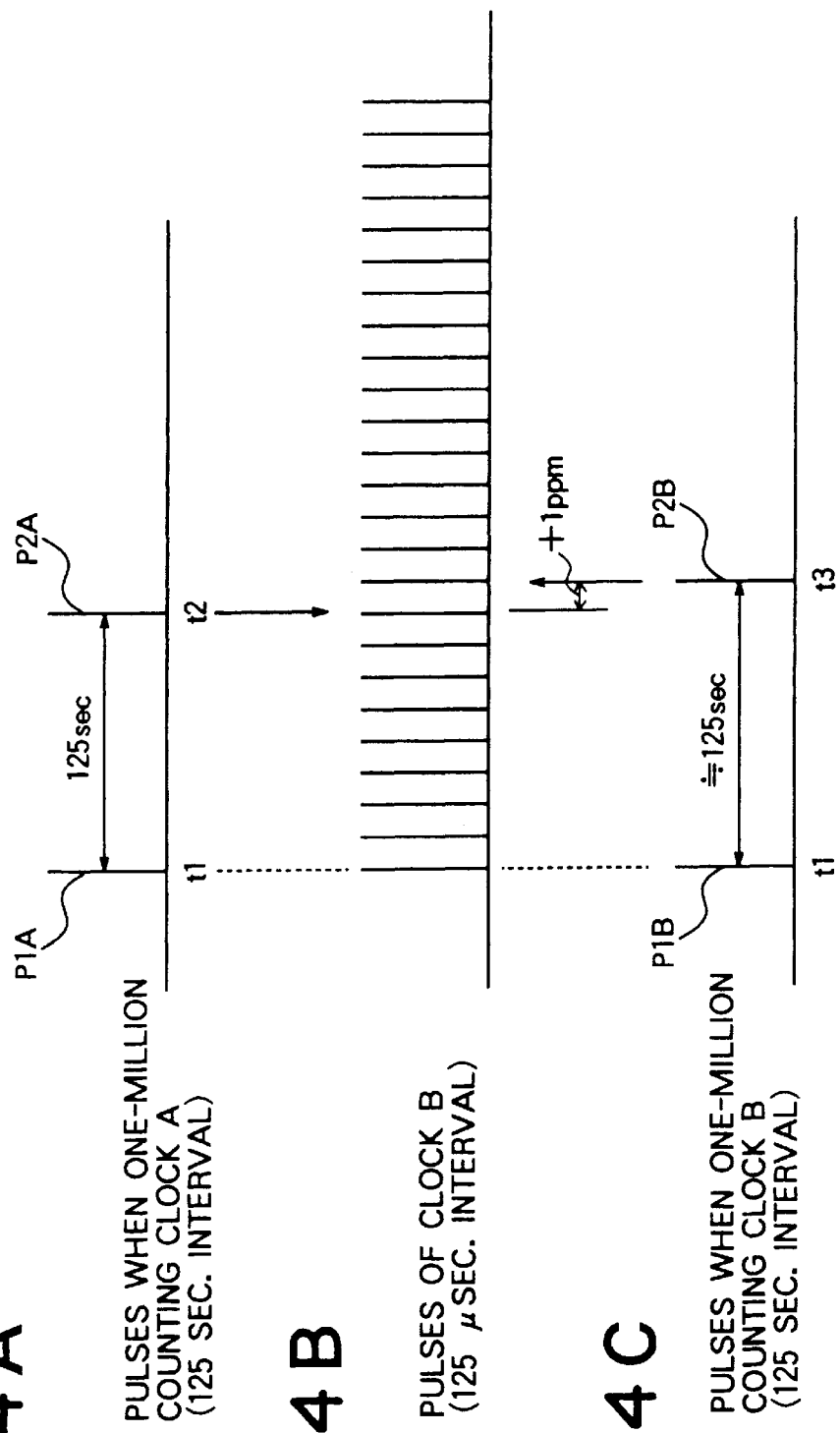
FIGS. 4A to 4C are timing charts for explanation of an operation of a frequency error detector shown in FIG. 3.

See FIGS. 4A to 4C, which are timing diagrams for explanation of an operation of the frequency error detector 103 at this stage of the operation mode, wherein FIG. 4A illustrates one typical reset pulse P1A for use upon start-up of counting the clock A for one million times and also a count-up pulse P2A with a time interval between them being 125 seconds. FIG. 4B depicts a pulse waveform of the clock signal B. FIG. 4C shows a reset pulse P1B for use upon startup of counting the clock B for one million times and a countup pulse P2B with a pulse interval therebetween being substantially 125 sec.

As apparent from FIGS. 4A–4C, both reset pulses P1A, P1B for count initiation of respective clock signals A, B are generated at a time point t1 thus letting clock signal A be exactly in phase with clock signal B. And, upon generation of the countup pulses P2A, P2B after completion of the one-million-time counting of respective clock signals A, B, any frequency error is detectable by determining how many clocks the two signals are phase-shifted or deviated by based on such countup pulses P2A, P2B. In this case the clock signal A is deviated by one pulse (125 $\mu$sec.) from clock signal B. Hence, the resulting frequency error detected might be +1 ppm as shown in FIG. 4B.

Meanwhile, the reference oscillator controller 104 converts a received error signal from the frequency error detector 103 into its corresponding voltage which is then applied to the reference oscillator 105 for oscillation control, thereby changing or modifying the frequency deviation of the reference clock signal C to send forth the resultant reference clock signal that is high in frequency stability.

One significant advantage of the illustrative digital cordless communication system in accordance with the first embodiment of the invention lies in the capability of enhancing the frequency stability of the reference frequency in wireless CSs 10 without having to receive RF signals from any other wireless devices. Another advantage is that those RF signals sent forth over-the-air from plural CSs 10 may be identical to or consistent with one another in frequency.

(SECOND EMBODIMENT)

An explanation will now be given of a second embodiment of the invention in conjunction with FIGS. 5–6, wherein the same parts or components are designated by the same reference numerals used in FIGS. 2–3, and a detailed description thereof will be eliminated herein.

Figure 5:
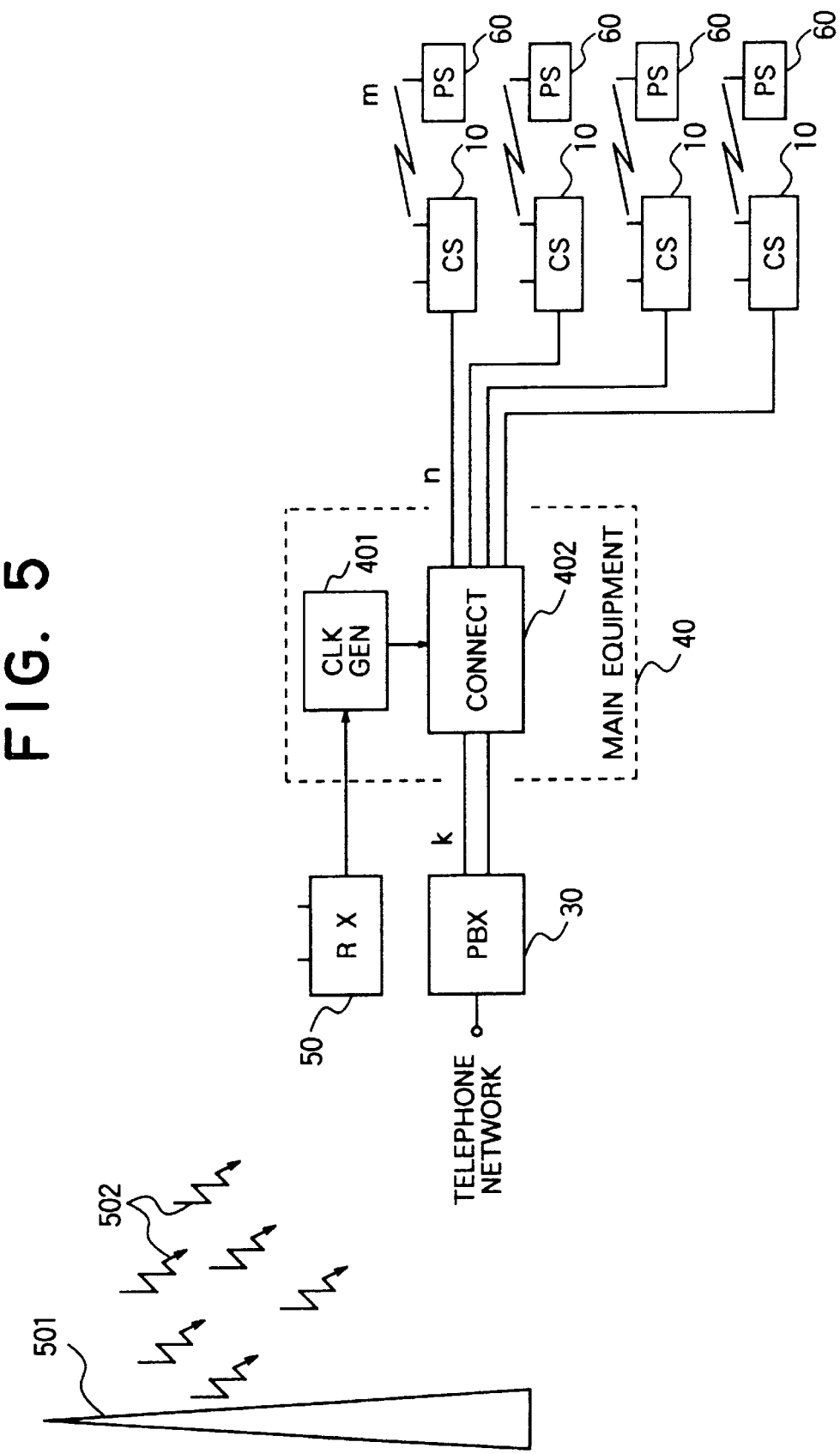
FIG. 5 is a block diagram showing a configuration of a mobile radiotelephone transceiver used in a digital cordless communication system in accordance with a second embodiment of the invention.

In FIG. 5, a wireless CS antenna 501 may be one of currently available antennas adaptable for use in an external telecommunication system such as, for example, a personal handyphone system (PHS) or a personal digital cellular (PDC) system. The antenna 501 is for sending forth over-the-air RF signals 502 of increased frequency stability as generated based on a high-accuracy clock signal. A wireless or radio receiver unit 50 is placed at a selected location to ensure that receiver 50 is capable of reliably receiving those RF signals from CS antenna 501 in all circumstances. A main equipment 40 includes a clock generator 401 for generating a high-precision clock signal based on a signal as presently received by the receiver 50, and an interconnection module 402 for connection of CSs 10 to PBX 30 by transmit-and-receive of digital signals using the high-precision clock signal. Main equipment 40 also functions to do position management in this system, including but not limited to management of information concerning geographical coverage areas or zones as preassigned to respective CSs 10.

Figure 6:
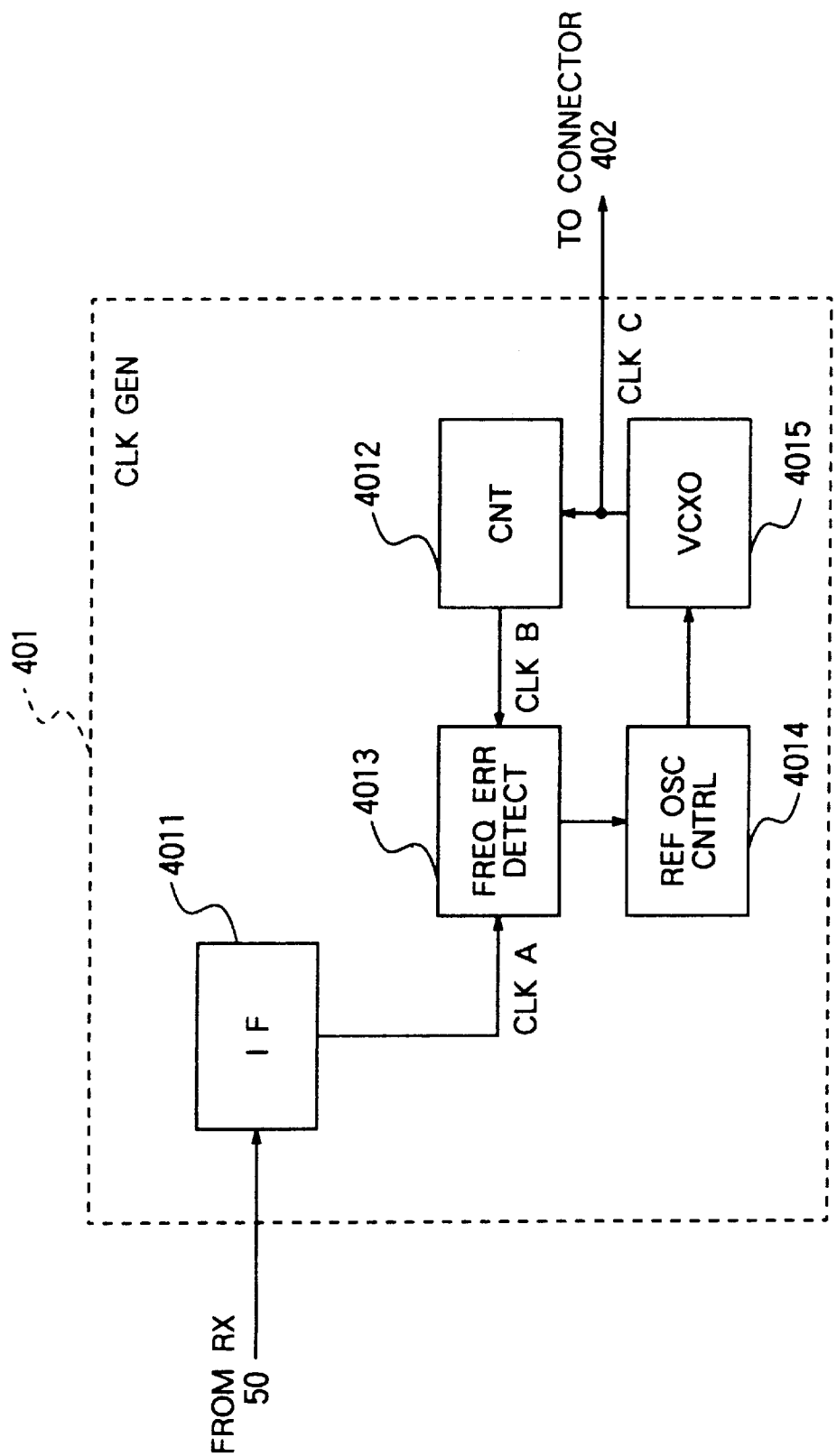
FIG. 6 is a block diagram showing a configuration of a clock generator unit shown in FIG. 5.

Turning to FIG. 6, the clock generator 401 includes a line interface 4011 operable to extract a high-precision clock component from a frequency-stability RF signal 502 from the wireless CS antenna 501 being presently received at the receiver 50 then outputting an extracted clock as the reproduced output signal A, a reference oscillator 4015 including the VCXO capable of changing or modifying any possible frequency deviation of the output clock signal in response to a control voltage as applied thereto, a counter 4012 for counting those pulses of a reference clock signal C from the reference oscillator 4015, a frequency error detector 4013 for detecting a frequency difference or error, if any, between the reproduced clock signal A extracted by line interface 4011 and the clock signal B as output from counter 4012, and a reference oscillator controller 4014 responsive to receipt of an error signal from frequency error detector 4013 for adjusting any possible oscillation frequency deviation at reference oscillator 4015, herein the clock signal C derived from reference oscillator 4015 is for use in signal processing of the connection module 402 permitting resultant signals to be passed to plural CSs 10.

It should be noted that those clocks as transmitted from the wireless CS antenna of a CS of a digital radio communication system such as PHS must be of high accuracy, some examples of which will be presented below.

| PHS Cell Station Standard (RCR-STD28) |
|---|
| Frequency Stability: ±3 ppm |
| PDC Cell Station Standard (RCR-STD27) |
| Frequency Stability: ±0.05 ppm |

In the system thus arranged, the wireless receiver 50 operates to receive the frequency stability RF signal 502 from CS antenna 501 to output it toward the clock generator 401 in main equipment 40. In the line interface 4011 of clock generator 401, the signal received at transceiver 50 is subjected to extraction of high-precision clocks which are then sent forth to frequency error detector 4013 as the reproduced clock signal A. The counter 4012 counts up pulses of the reference clock signal C from reference oscillator 4015 for frequency division of the clock signal to ensure that this signal is exactly the same in frequency as the reproduced clock signal A, then outputs it to frequency error detector 4013 as clock signal B. Upon reception of such clock signals A and B, frequency detector 4013 attempts to detect how clock signal B deviates in frequency from clock signal A in a way similar to that in the case shown in FIGS. 4A–4C.

When this is done, the reference oscillator controller 4014 controls an operation of the reference oscillator 4015 by conversion of the error signal from frequency error detector 4013 to a corresponding voltage to be applied to reference oscillator 4015, thus varying the clock signal C in frequency deviation to thereby send forth an intended clock signal C with frequency stability maximized. This makes it possible to transmit high-precision clock information equivalent in quality to those external RF signals toward plural CSs 10 operatively coupled to main equipment 40, which may in turn enable an increase or maximization of the frequency stability of associative wireless CSs without raising the need for implementation of any additional high-precision oscillator in the main equipment per se as shown in the first embodiment.

It has been described that the principles of this invention may enable achievement of constantly increased or maximized frequency stability of RF signals of the CSs.

Although the invention has been disclosed and illustrated with reference to particular illustrative embodiments, the principles involved are susceptible for use in numerous other embodiments, modification and alterations which will be apparent to persons skilled in the art to which the invention pertains. The invention is, therefore, to be limited only as indicated by the scope of the appended claims.

What is claimed is:

1. A digital cordless communication system with a clock signal frequency stabilizing capability, said system comprising:

a plurality of stationary base stations communicable with multiple mobile communication units within respective geographical coverage areas assigned to said plurality of base stations;

a system controller for connection of said plurality of base stations to a public analog-type telephone network;

said system controller including a high-precision oscillator for generating and transmitting a master clock signal to each of said stationary base stations and means for transmitting an analog telephone signal through A/D conversion with said master clock signal to any of said Plurality of base stations; and each of said plurality of base stations including a clock generator for generating, in response to the master clock signal transmitted from said system controller, a reference clock signal having a frequency to be in a predetermined range of that of said master clock signal.

2. The digital cordless communication system according to claim 1, wherein said clock generator includes:

a line interface section for generation of a reproduced clock signal of the frequency of said master clock signal;

a reference oscillator for generation of the reference clock signal with a frequency determinable by a control signal as fed thereto;

a counter for frequency division of the reference clock signal to generate a frequency-divided reference signal;

a frequency error detector section for detecting a frequency difference between said frequency-divided reference signal and the reproduced clock signal to generate an error signal indicative of the frequency difference; and a reference oscillator control section for generating the control signal to control said reference oscillator on the basis of the error signal to thereby generate the reference clock signal having a frequency to be in said predetermined range of that of said master clock signal.

3. The digital cordless communication system according to claim 2, wherein said reference oscillator includes a voltage controlled crystal oscillator and said control signal generated by said reference oscillator control section is a control voltage.

4. The digital cordless communication system according to claim 2, wherein the frequency of said reference oscillator is controlled substantially by the frequency of said master clock signal.

5. The digital cordless communication system according to claim 1, wherein said system controller manages information as to the geographical coverage areas assigned to said plurality of base stations.

6. The digital cordless communication system according to claim 1, wherein said system controller is connectable to said telephone network via a private branch exchange facility.

7. The digital cordless communication system according to claim 1, further comprising:

a frequency synthesizer for generation of a local oscillation signal on the basis of the reference clock signal; and a transmitter for generating a transmission signal on the basis of the local oscillation signal.

8. The digital cordless communication system according to claim 7, wherein the frequency synthesizer which generates the local oscillation signal is adjustable individually by each respective base station.

9. The system controller adapted for use in the digital cordless communication system according to claim 1.

10. A digital cordless communication system with a clock signal stabilizing capability, said system comprising:

a plurality of stationary base stations communicable with multiple mobile communication units within respective geographical coverage areas assigned to said plurality of base stations;

a system controller for connection of said plurality of base stations to a public analog-type telephone network;

a radio receiver for receiving a radio frequency-stabilized RF signal as externally transmitted thereto and outputting an output signal in accordance with said radio frequency signal to said system controller;

said system controller including a first clock generator for, responsive to said output signal, generating a master clock signal of high precision frequency to be in a predetermined range of the frequency-stabilized RF signal received by said radio receiver and for transmitting the master clock signal to each of said stationary base stations, and means for transmitting an analog telephone signal through A/D conversion with the master clock signal high precision frequency to any of said base stations;

each of said plurality of base stations including a second clock generator for receiving the master clock signal high precision frequency from said system controller and for generating a second reference clock signal of a frequency to be in a predetermined range of the high precision frequency of said master clock signal.

11. The digital cordless communication system according to claim 10, wherein said first clock generator includes:

a line interface for generating a reproduced clock signal of a frequency of that of the radio frequency-stabilized RF signal received by said radio receiver;

a reference oscillator for generating the master clock signal having a frequency determinable by a control signal fed thereto;

a counter for frequency division of the master clock signal to generate a frequency-divided reference signal;

a frequency error detector for detecting a frequency difference between said frequency-divided master clock signal and the reproduced clock signal to generate an error signal indicative of the frequency difference; and a reference oscillator controller for generating the control signal to control said reference oscillator on the basis of the error signal to thereby generate the master clock signal high precision frequency to be in said predetermined range of the received frequency-stabilized RF signal.

12. The digital cordless communication system according to claim 11, wherein said first clock generator is a high-precision oscillator which includes a voltage controlled crystal oscillator.

13. The digital cordless communication system according to claim 11, wherein said master clock signal high precision frequency is controlled substantially to that of said output frequency-stabilized RF signal.

14. The digital cordless communication system according to claim 10, wherein said system controller manages information as to the geographical coverage areas assigned to said plurality of base stations.

15. The digital cordless communication system according to claim 10, wherein said system controller is connectable to said telephone network via a private branch exchange facility.

16. The system controller adapted for use in the digital cordless communication system according to claim 7.

17. A digital cordless communication system with a clock signal frequency stabilizing capability, comprising a plurality of base stations assigned for communication with multiple mobile communication units and a system controller for connecting said base stations to a public telephone network; said system for stabilizing a reference clock signal frequency to each of the mobile communication units, wherein said system controller includes a high-precision oscillator for generating a high-precision master clock signal frequency and includes means for transmitting to each of said bass stations the master clock signal and telephone signals from said telephone network through A/D conversion with the master clock signal; and wherein each of said base stations includes PLL means for operating with the high-precision master clock signal frequency to generate the reference clock signal frequency controlled to be in a predetermined range of said master clock signal frequency by counting a frequency of the generated reference clock signal and having a possible difference reduced between the counted frequency and said high precision master clock signal frequency.

18. A system according to claim 17, wherein said PLL means comprises:

a line interface for extracting a clock signal of the master clock signal frequency of said high-precision oscillator;

a reference oscillator for controllably generating the reference clock signal with a frequency determinable by a control signal;

a counter for counting a frequency of the generated clock signal to generate a counted frequency signal;

a frequency error detector for detecting the possible difference between said counted frequency signal and the extracted clock signal frequency to generate an error signal of the detected difference; and a reference oscillator control for generating the control signal based on said error signal to control said reference oscillator to reduce said difference, thereby determining the frequency of said reference clock signal.

19. A system according to claim 18, wherein said reference clock signal frequency is controlled substantially to said high precision master clock signal frequency.

20. A digital cordless communication system with a clock signal frequency stabilizing capability, comprising a plurality of base stations assigned for communication with multiple mobile communication units, a system controller for connecting said base stations to a public telephone network, and a radio receiver for receiving to output a radio frequency-stabilized RF signal, said system for stabilizing a high-precision master clock signal frequency to be in a predetermined range of a frequency of the output frequency-stabilized Rr signal to each of said base stations, said system controller including means for transmitting to each of said base stations the master clock signal and telephone signals from said telephone network through A/D conversion with the master clock signal, wherein said system controller includes a first clock generator comprising PLL means to operate with said output radio frequency-stabilized RF signal to generate the high-precision easter clock signal of a frequency controlled to be in said predetermined range of the frequency of said output RF signal by counting a frequency of the generated master clock signal and reducing a possible difference between the counted frequency and the output RF signal frequency.

21. A system according to claim 20, wherein said PLL means comprises:

a line interface for extracting a clock signal of a high precision frequency from said output frequency-stabilized RF signal;

a reference oscillator for controllably generating the master clock signal with a frequency determinable by a control signal;

a counter for counting a frequency of the generated master clock signal to generate a counted frequency signal;

a frequency error detector for detecting the possible difference between the counted frequency and the extracted clock signal frequency to generate an error signal of the detected difference; and a reference oscillator control for generating the control signal based on said error signal to control said reference oscillator to reduce said difference, thereby determining the frequency of said high-precision master clock signal.

22. A system according to claim 21, wherein each of said base stations includes a second clock generator comprising PLL means for operating with the high-precision master clock signal frequency to generate a further reference clock signal frequency to each of said mobile communication units, said further reference clock signal frequency being controlled to be in a predetermined range of said master clock signal frequency by counting a frequency of the generated reference clock signal and having a possible difference reduced between the counted frequency and said high precision master clock signal frequency.

23. A system according to claim 22, wherein the frequencies of said high precision master clock signal and said further reference clock signal are controlled substantially to the frequency of said output radio frequency-stabilized RF signal.

* * * * *